US006412989B1

(12) United States Patent
Hartman et al.

(10) Patent No.: US 6,412,989 B1
(45) Date of Patent: Jul. 2, 2002

(54) DIRECTABLE LASER TRANSMISSION MODULE

(75) Inventors: Davis Howard Hartman, Scottsdale; Daniel Bruce Schwartz, Gold Canyon, both of AZ (US); Michael Stephen Lebby, Hershey, PA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,218

(22) Filed: Apr. 10, 2000

(51) Int. Cl.[7] ............................................. G02B 6/36
(52) U.S. Cl. ....................................... 385/89; 385/93
(58) Field of Search ....................... 385/88–94; 356/445, 356/447; 205/226

(56) References Cited

U.S. PATENT DOCUMENTS

| 4,850,662 A | 7/1989 | Chen ........................ 350/3.72 |
| 5,266,794 A | 11/1993 | Olbright ............... 250/214 LS |
| 5,548,427 A | 8/1996 | May .............................. 359/73 |
| 5,563,710 A | * 10/1996 | Webb et al. ................. 356/445 |
| 5,574,738 A | 11/1996 | Morgan ........................ 372/28 |
| 5,650,612 A | * 7/1997 | Criswell et al. ............. 250/226 |
| 5,832,147 A | 11/1998 | Yeh et al. ..................... 385/14 |

* cited by examiner

Primary Examiner—Ellen Kim
(74) Attorney, Agent, or Firm—Ingrassia Fisher & Lorenz; Frank J. Bogacz

(57) ABSTRACT

A directable laser transmission module incorporating a vertical cavity surface emitting laser (VCSEL) array (28) and a refractive optical element (ROE) array (36) is provided. Each VCSEL (30) generates a laser beam (32) having an axis (44) substantially perpendicular to a substrate (42). The ROE array (36) is positioned proximate the VCSEL array (28) substantially parallel to the substrate (42) so that each laser beam (32) is intersected by only one ROE (34). Each of a plurality of communication signals is carried by at least one laser beam (32). An laser beam (32) carrying a one-beam signal is intersected, collimated, and directed by a single ROE (34) to its predetermined reception location (24). A plurality of laser beams (32) carrying a single multiple-beam signal is intersected, collimated, and directed by multiple ROEs (34) to a common predetermined reception location (24).

19 Claims, 2 Drawing Sheets

DIRECTABLE LASER TRANSMISSION MODULE

TECHNICAL FIELD OF THE INVENTION

The present invention relates to the field of laser communications. More specifically, the present invention relates to the field of laser directional control through refractive optical elements.

BACKGROUND OF THE INVENTION

In the optical propagation of communication signals, the conventional approach is through the use of glass fiber "cables," i.e., fiber optics. Fiber optics allows the propagation of clean, noise-free signals of high bandwidth that are effectively immune to electromagnetic interference. In an exemplary downlink application, a trunk (i.e., multifiber) cable is run to a distribution head, where each of the individual downlink fibers of the trunk cable is spliced to a downlink fiber of a service (i.e., single fiber each direction) cable. The service cable is then routed to a local apparatus. A reverse approach occurs in the uplink direction, where applicable.

A communication signal distribution system for a housing or business tract may utilize the exemplary scheme described above. The trunk cable is coupled at a local distribution head into service cables for each building, with the local apparatus being an optoelectronic transceiver at each building configured to convert between the optical downlink and uplink signals and internal electronic (wired) signals. The wide bandwidth possible with optical signals allows multiple simultaneous television, music/news, telephone, fax, hi-speed data (computer), security, and other signals to be received and/or transmitted.

One disadvantage of the above housing or business tract scheme is that, to meet contemporary zoning codes and/or construction practices, the service cables from the distribution head to each building may need to be buried. Cable burial poses problems of cost, implementation, and upkeep/repair. It may cost from thousands to millions of dollars per kilometer to bury cable. Usually, the more urban or built-up the area, the greater is the per-kilometer cost of cable burial. In many cases, the cost of cable burial is prohibitive.

Additionally, a disadvantage of cable burial is the burial itself. It may not always be practical or even possible to bury a cable (optical or wire), as where a cable may have to cross third party property, a canyon or gorge, a river or lake, etc.

Buried cables are subject to damage. Cables may be damaged by street repair or utility crews during maintenance or installation of services. Similarly, individuals may damage cables during the installation, maintenance, or repair of pools, spas, irrigation systems, landscaping, septic and sewage lines, etc. Those skilled in the art are well familiar with the problems that plague buried cables.

Another disadvantage of using fiber optics is the installation of the optical fibers themselves. While an acceptable propagation medium, an optical fiber requires a labor intensive installation. Careful and time-consuming alignment between the optical fiber and a terminating laser or photodiode is required. This contributes significantly to the overall cost of a fiber optic system.

Cable burial and fiber termination problems may be eliminated by using an aerial or spatial transmission scheme. In this approach, a collimated beam is transmitted directly through the atmosphere (or through space) from a transmission location to a reception location. A reciprocal beam may likewise be aerially or spatially transmitted for bidirectional communication.

Aerial transmission has problems with collimation and penetration. Typically, an aerial laser transmission scheme uses some sort of optical collimator (e.g., a telescope) to produce a highly collimated beam from a laser at the collimator's focal point. In a distribution head serving a large number of clients, the use of individual collimators leads to a costly complexity both in materials and in installation. Since each collimator is essentially a telescope, many collimators means many tubes, many lenses, and many mounts, all of which add to the system cost. Since each collimator must be individually aimed at its target, the use of many collimators involves a complex and time-consuming installation procedure.

The transmitted aerial laser beams of any system serve no function unless they are received. If the transmissivity of the atmosphere is such as to absorb the beam prior to reception, then the beam is worthless and the link is broken. Typical solutions for transmissivity problems are improvements in collimation and increases in power. Both solutions serve the same function, i.e., to increase the flux density at the receiver.

If a given photoreceptor has a specific lumen threshold, then the photonic flux falling upon that photoreceptor (the received flux) must be above that specific lumen threshold to be significant. Two ways in which the received flux may be increased include an improvement in collimation and an increase in transmitted optical power.

A given laser beam has a specific total photonic value. As the laser beam diverges, this total photonic value is spread over an ever-increasing area, i.e., the flux density decreases. At the target distance the beam therefore exhibits a specific received flux density. With an improvement in collimation, the beam has a smaller diameter at the target distance and the received flux density is increased. Presuming for discussion purposes that the distance between transmitter and receiver is constant, an increased flux density permits the reception of an adequate signal with a reduced atmospheric transmissivity. Similarly, with an increase in transmitted flux, the received flux density is increased. Again, an increased flux density permits the reception of an adequate signal with a reduced atmospheric transmissivity.

Likewise, for a given atmospheric transmissivity, an improvement in collimation or an increase in transmitted flux, the received flux density is increased and the distance between transmitter and receiver may be increased while maintaining an adequate reception signal.

What is needed, therefore is a device allowing individual, simultaneous, and cost-effective control over the collimation and transmitted flux density of a plurality of laser beams in a distribution head.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF THE PREFERRED EMBODIMENTS

Figure 1:
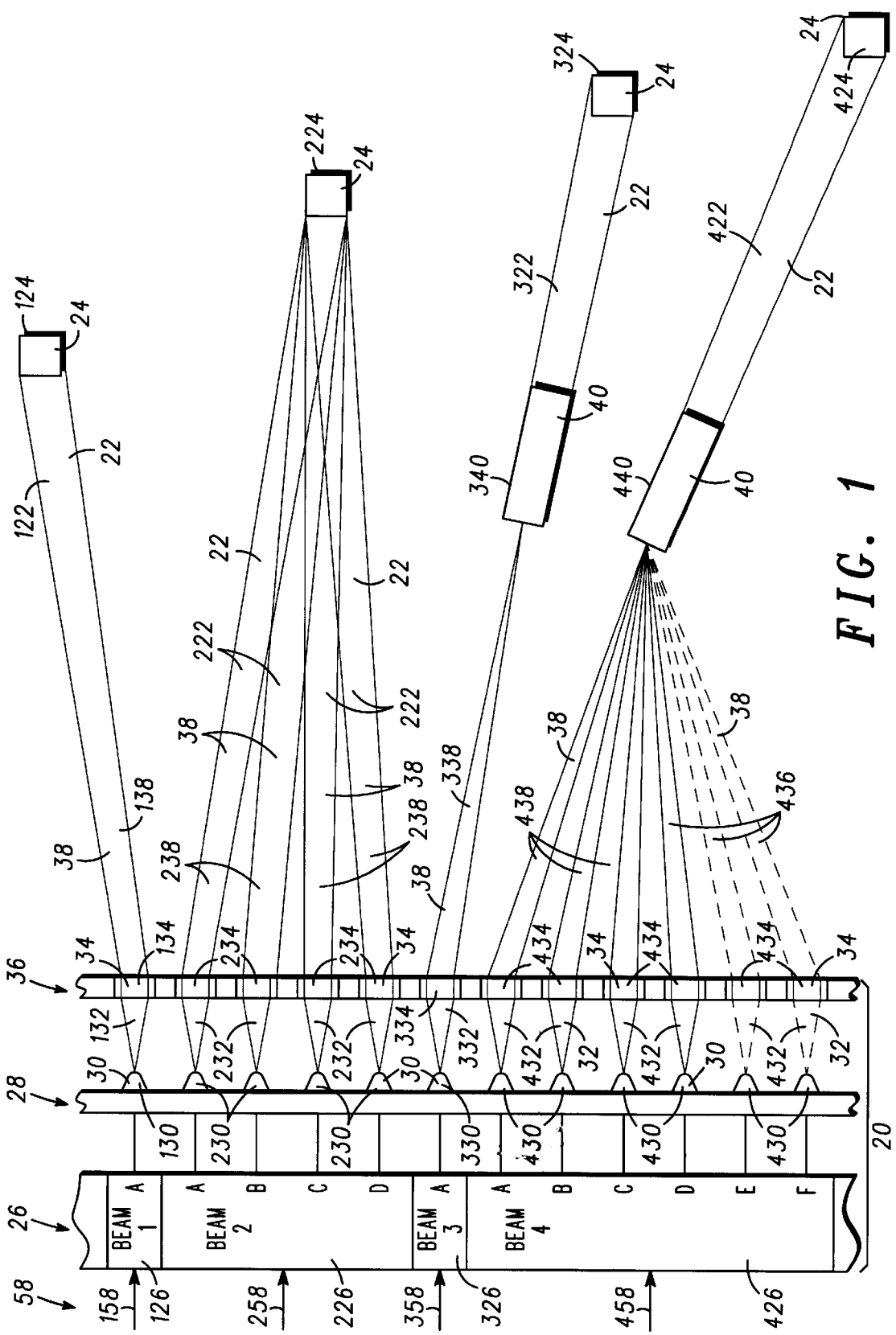
FIG. 1 shows a schematic view depicting a laser transmission module generating a plurality of target beams in accordance with a preferred embodiment of the present invention.

FIG. 1 shows a schematic view depicting a directable laser transmission module 20 generating a plurality of target laser beams 22 in accordance with a preferred embodiment of the present invention.

Directable laser transmission module 20 produces target laser beams 22 propagating from laser transmission module 20 to optical receivers (not shown) at predetermined reception locations 24. In laser transmission module 20, a beam controller 26 is used to control current to an array 28 of vertical cavity surface emitting lasers (VCSELs) 30 in response to communication signals 58. Those skilled in the art will appreciate that beam controller 26 may be a simple signal mixing and directing matrix, a computer-controlled signal distributor, or other VCSEL controlling entity. The use of a specific form for beam controller 26 does not depart from the spirit of the present invention.

VCSEL array 28 should ideally contain more than eight VCSELs 30 in order to be cost-effective. Each VCSEL 30 activated by beam controller 26 emits a VCSEL laser beam 32. Each VCSEL laser beam 32 is intersected, collimated, and directed by a single refractive optical element (ROE) 34 within an array 36 of ROEs 34 to become a ROE laser beam 38. A given ROE laser beam 38 may directly or convertibly be all or a portion of a given target laser beam 22.

Those skilled in the art will appreciate that the term "collimate" is used herein in the sense of "acting as a convex lens," i.e., "acting so as to cause a divergent beam to become less divergent." A given ROE 34 may therefore be said to collimate a divergent beam when it causes that beam to become more cylindrical and/or convergent.

Those skilled in the art will also appreciate that refractive optical elements (ROEs) 34 recited herein may be holographic optical elements (HOEs), diffractive optical elements (DOEs), or other substantially planar optical elements suitable for diffracting and/or refracting a laser beam. The use of HOEs offers a distinct advantage due to their low cost and ease of production. Two centered laser beams, one from the VCSEL side substantially perpendicular to the HOE, and the other from the target side and forming the same compound angle ultimately to be formed by ROE laser beam 38, are all that is required to produce a HOE. The use of any specific or combination of optical elements as ROEs 34, however, does not depart from the spirit of the present invention.

In FIG. 1, four types of target laser beams 22 are depicted. In a first example, where the target is relatively close, minimal collimation and flux density is required of a first target laser beam 122 at a first-beam reception location 124, e.g., where the target is optically close. To meet these requirements, a first-beam communication signal 158 is routed to a first-beam subcontroller 126 of beam controller 26. Subcontroller 126 independently controls a single first-beam VCSEL 130 of array 28 to produce a single first-beam VCSEL laser beam 132 modulated with signal 158. VCSEL laser beam 132 is intersected by a single first-beam ROE 134. ROE 134 then collimates and directs the resultant first-beam ROE laser beam 138 to reception location 124.

Those skilled in the art will appreciate that a single contiguous laser beam extends from VCSEL 130 to reception location 124. That single laser beam is individually controlled by subcontroller 126 and is referred herein as VCSEL laser beam 132 when generated by VCSEL 130, as ROE laser beam 138 when intersected, collimated, and directed by ROE 134, and as target laser beam 122 when arriving at reception location 124.

In a second example, minimal collimation but higher flux density than can be provided by one VCSEL 30 is required of a second target laser beam 222 at a second-beam reception location 224, e.g., where the target is optically farther than that for first target laser beam 122. To meet these requirements, a second-beam communication signal 258 is routed to a second-beam subcontroller 226 of beam controller 26. Subcontroller 226 collectively controls a plurality of second-beam VCSELs 230 of array 28 to produce a plurality of second-beam VCSEL laser beams 232 modulated with signal 258. VCSEL laser beams 232 are intersected by a like plurality of second-beam ROEs 234. ROEs 234 then collimate and direct each resultant second-beam ROE laser beam 238 to reception location 224. Target laser beam 222 is therefore a composite of each of the laser beams 232/238 controlled by subcontroller 226.

Those skilled in the art will appreciate that a plurality of contiguous laser beams extends from VCSELs 230 to reception location 224. That plurality of laser beams is collectively controlled by second-beam subcontroller 226. Within that plurality of laser beams, each laser beam is capable of being independently controlled by subcontroller 226, with each active laser beam being referred to as VCSEL laser beam 232 when generated by VCSEL 230 and as ROE laser beam 238 when intersected, collimated, and directed by ROE 234. All active laser beams 232/238 together are referred to as composite target laser beam 222 when arriving at reception location 224.

In a third example, minimal flux density but higher collimation than can be provided by one ROE 34 is required of third target laser beam 322 at a third-beam reception location 324, e.g., where the target is optically farther than that for first target laser beam 122. To meet these requirements, a third-beam communication signal 358 is routed to a third-beam subcontroller 326 of beam controller 26. Subcontroller 326 independently controls a single third-beam VCSEL 330 of array 28 to produce a single third-beam VCSEL laser beam 332 modulated by signal 358. VCSEL laser beam 332 is intersected by a single third-beam ROE 334. ROE 334 then convergently collimates and directs (i.e., focuses) the resultant third-beam ROE laser beam 338 at the focal point of a third-beam collimator 340. Collimator 340 then further collimates and directs target laser beam 322 to reception location 324.

Those skilled in the art will appreciate that a single contiguous laser beam extends from VCSEL 330 to reception location 324. That single laser beam is controlled by third-beam subcontroller 326 and is referred to as VCSEL laser beam 332 when generated by VCSEL 330, as ROE laser beam 338 when intersected, convergently collimated, and directed by ROE 334, and as target laser beam 322 when further collimated by collimator 340 and arriving at reception location 324.

In a fourth example, higher collimation than can be provided by one ROE 34 and higher flux density than can be provided by one VCSEL 30 is required of a fourth target laser beam 422 at a fourth-beam reception location 424, e.g., where the target is optically farther than that for first, second, or third target laser beams 122,. To meet these requirements, a fourth-beam communication signal 458 is routed to a fourth-beam subcontroller 426 of beam controller 26. Subcontroller 426 collectively controls a plurality of fourth-beam VCSELs 430 of array 28 to produce a plurality of fourth-beam VCSEL laser beams 432 modulated with signal 458. VCSEL laser beams 432 are intersected by a like plurality of fourth-beam ROEs 434. ROEs 434 then convergently collimate and direct (i.e., focus) each resultant fourth-beam ROE laser beam 438 at the focal point of a fourth-beam collimator 440. Collimator 440 then further collimates and directs target laser beam 422 to reception location 424.

Those skilled in the art will appreciate that a plurality of contiguous laser beams extends from VCSELs 430 to reception location 424. That plurality of laser beams is collectively controlled by fourth-beam subcontroller 426. Within that plurality of laser beams, each laser beam is capable of being independently controlled by subcontroller 426, with each active laser beam being referred to as VCSEL laser beam 432 when generated by VCSEL 430 and as ROE laser beam 438 when intersected, convergently collimated, and directed by ROE 434. All active laser beams 432/438 together are referred to as composite target laser beam 422 when further collimated by collimator 440 and arriving at reception location 424.

Not all VCSELs 30 under control of a given composite-beam subcontroller of beam controller 26 need be active at the same time. Fourth-beam subcontroller 426, for example, is depicted in FIG. 1 as controlling beams 4A through 4F, with only beams 4A through 4D active. By having subcontroller 426 independently activate each beam while collectively control all activated beams, composite target laser beam 422 may contain any number of laser beams 432/438 from one to the total number of VCSELs 430 allocated to subcontroller 426.

Those skilled in the art will appreciate that the four examples discussed in connection with FIG. 1 are demonstrative of a few of the possible methodologies that may be used to generate and convey target laser beam 22 to predetermined reception location 24, and that the use other methodologies does not depart from the spirit of the present invention.

Figure 2:
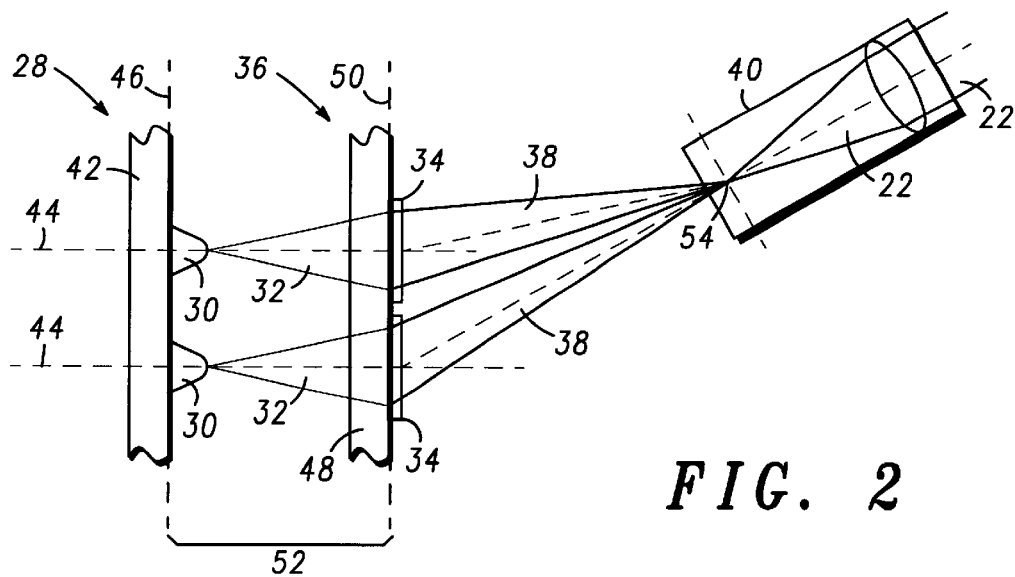
FIG. 2 shows a schematic view depicting a relationship between components of a directable laser transmission module in accordance with a preferred embodiment of the present invention.

FIG. 2 shows a schematic view depicting a relationship between components of directable laser transmission module 20 in accordance with a preferred embodiment of the present invention. The following discussion refers to FIGS. 1 and 2.

VCSEL array 28 is formed on a substantially planar substrate 42, typically of silicon, with VCSELs 30 formed in predetermined locations upon substrate 42. Since each VCSEL 30 is a vertical cavity surface emitting laser, each VCSEL 30 emits an VCSEL laser beam 32 along an axis 44 that is substantially perpendicular to substrate 42, i.e., beam axis 44 would be vertical were a plane 46 of substrate 42 to be horizontal.

Similarly, ROE array 36 is formed on a substantially planar medium 48 with ROEs 34 formed in substantially the same predetermined locations upon medium 48 that VCSELs 30 have upon substrate 42. ROE array 36 is positioned so that a plane 50 thereof is substantially parallel to substrate plane 46 and each beam axis 44 passes substantially through a center (not shown) of one of ROEs 34. Because of this, ROE array 36 contains at least as many ROEs 34 as VCSEL array 28 contains VCSELs 30. That is, if VCSEL array 28 contains N VCSELs 30, where "N" is a positive integer, then ROE array 36 contains at least N ROEs 34.

Each VCSEL 30 produces, when activated, a divergent VCSEL laser beam 32. ROE array 36 is desirably positioned substantially parallel to VCSEL array 28 at a distance 52 such that each divergent VCSEL laser beam 32 illuminates (i.e., is intersected by) one and only one ROE 34. Each individual VCSEL laser beam 32 may therefore be collimated and directed to a specific target without interference from other VCSEL laser beams 32.

In FIG. 2, two exemplary VCSEL laser beams 32 are independently intersected, collimated, and directed by separate ROEs 34 to a common target. As depicted, this target is a focal point 54 for a simple collimator 40. Those skilled in the art will appreciate that each ROE 34 therefore acts as a simple prismatic lens (not shown) to create a virtual image of both VCSELs 30 at focal point 54. Collimator 40 then projects those virtual images as a single composite target laser beam 22.

While FIG. 2 depicts a simplistic two-VCSEL case utilizing collimator 40, those skilled in the art will appreciate that any number of VCSELs 30 from one to the entirety of VCSEL array 28 may be used with a like number of ROEs 34 to generate target laser beam 22. That is, each VCSEL 30 used to generate a specific target laser beam 22 generates a portion of that target laser beam 22, where a portion may, in this instance, be up to and including the entirety of that target laser beam 22. It will also be appreciated that collimator 40 is used to decrease beam divergence and increase beam penetration. Collimator 40 is therefore used when the distance of reception location 24 and/or the transmissivity of the intervening atmosphere prevent reception of an adequate signal without post-ROE collimation. Collimator 40 is not required when the divergence and penetration of ROE laser beam 38 permits an adequate signal reception at reception location 24.

It is a distinct advantage of the present invention that more VCSELs 30 may be assigned to a given reception location 24 than is required under all circumstances (see target laser beam 422 in FIG. 1). This allows the number of VCSELs 30 activated by beam controller 26 to be varied as required. For example, a given reception location 24 may receive an adequate signal over a one-VCSEL target laser beam 22 when the atmosphere is clear, but require a twenty-VCSEL target laser beam 22 only during fog with all twenty VCSELs 30 being collectively controlled (i.e., operated in parallel) by beam controller 26. A significant savings in energy may therefore be realized by activating only the number of VCSELs 30 required for the specific conditions.

Figure 3:
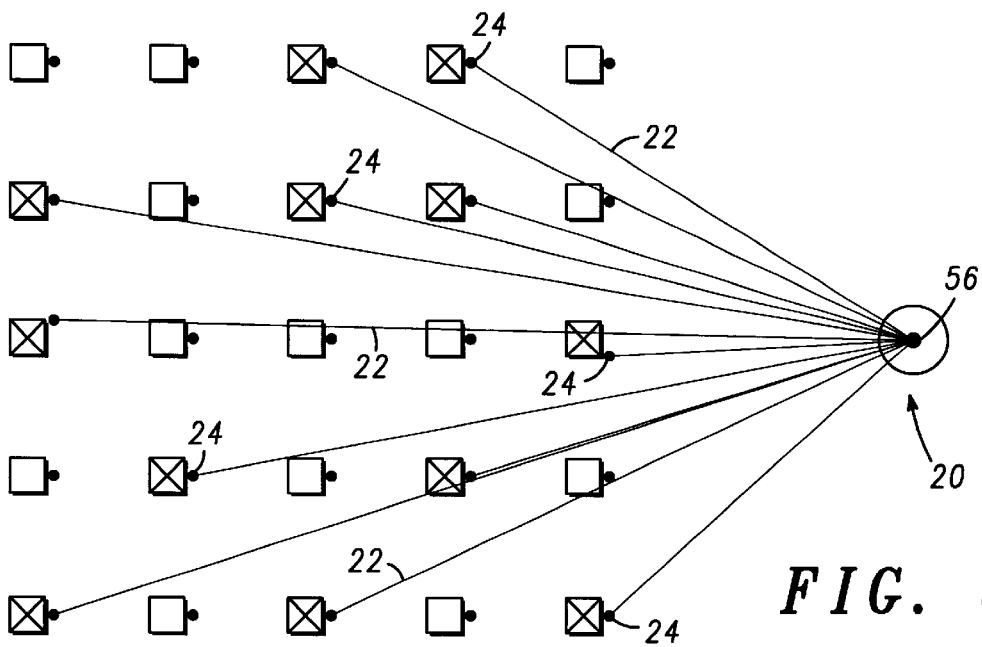
FIG. 3 shows a plan view depicting a laser transmission module directing laser beams to receiver locations in a plurality of azimuthal directions in accordance with a preferred embodiment of the present invention.
Figure 4:
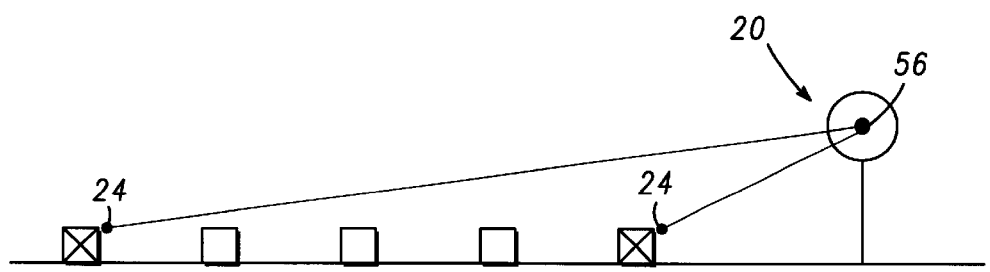
FIG. 4 shows a side view of a portion of FIG. 3 depicting a laser transmission module directing laser beams to receiver locations in a plurality of altitudinal directions in accordance with a preferred embodiment of the present invention.

FIGS. 3 and 4 depict directable laser transmission module 20 mounted at a predetermined transmission location 56 and directing target laser beams 22 to reception locations 24 in a plurality of azimuthal (FIG. 3) and altitudinal (FIG. 4) directions in accordance with a preferred embodiment of the present invention. The following discussion refers to FIGS. 1 through 4.

In one exemplary installation, directable laser transmission module 20 may be used to provide direct wideband wireless communications with the houses or businesses in a tract. These communications may include telephone, television, audio/music, Internet, and security/monitoring services. Each building in the tract would be a potential reception location 24, though at any given time any given building may not be targeted. For those reception locations 24 optically close to transmission location 56 (e.g., within 50 meters in clear air, assuming a beam with a nominal divergence of 1°), a single VCSEL 30 and its associated ROE 34 may be sufficient to provide an adequate received flux density (see target laser beam 122 in FIG. 1). For reception locations 24 optically farther away from transmission location 56 (e.g., in hazy air, or within a few kilometers in clear air) multiple VCSELs 30 may be required (see target laser beam 222 in FIG. 1). Alternatively, for reception locations 24 optically farther from transmission location 56, a single VCSEL 30 may be used with a collimator 40 (see target laser beam 322 in FIG. 1). For reception locations 24 optically farthest from transmission location 56 (e.g., through fog or rain, or beyond a few kilometers in clear air), multiple VCSELs 30 may be used with collimator 40.

FIGS. 3 and 4 exemplify a housing or business tract application. By mounting directable laser transmission module 20 on a pole, tower, or building overlooking the field of reception locations 24, each reception location 24 maintains a different altazimulthal relationship to transmission location 56. That is, each target laser beam 22 from laser transmission module 20 will be projected at a different compound angle relative to laser transmission module 20, having a unique combination of azimuth and altitude (elevation) angles.

In summary, the present invention teaches the use of ROE array 36 in conjunction with VCSEL array 28 to provide directable laser transmission module 20 for downlink communications. A given target laser beam 22 may be generated by any number of VCSELs 30, from one to the totality of VCSELs 30 in array 28, with each VCSEL laser beam being intersected, collimated, and directed by a single ROE 34 of array 36. Collimator 40 may be used to decrease the divergence and increase the penetration of target laser beam 22.

This discussion utilizes an exemplary housing or business tract application and emphasizes atmospheric transmission of target laser beams 22 over varying optical distances (i.e., varying distances and/or atmospheric transmissivity). Those skilled in the art will appreciate that the directable laser transmission module discussed herein is applicable wherever directed fiberless laser communications are desired, including where optical fibers are commonly used, and anywhere the running of optical fibers is undesirable, prohibitive, or impossible.

Those skilled in the art will appreciate, however, that ROEs 34 are bidirectional. Therefore, while this discussion emphasizes the use of VCSEL array 28 and ROE array 36 to provide downlink communications, a similar ROE array may be used in conjunction with a photoreceptor array to provide a directable laser reception module for uplink communications.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A directable laser transmission module residing at a predetermined transmission location and configured to direct a plurality of communication signals to a plurality of predetermined reception locations, said module comprising:

a beam controller having a first-beam subcontroller that is configured to receive a first communication signal of said plurality of communication signals;

a laser array coupled to said beam controller, said laser array having a first-beam plurality of vertical cavity surface emitting laser coupled to said first-beam subcontroller, wherein said first-beam vertical cavity surface emitting laser is configured to generate a first-beam vertical cavity surface emitting laser beam under the control of said first-beam subcontroller that is modulated with said first communication signal; and an element array having a first refractive optical element positioned proximate said laser array and configured so that said first-beam vertical cavity surface emitting laser beam is intersected and a resultant first refractive optical element laser beam is directed to a first predetermined reception location of said plurality of predetermined reception locations.

2. A directable laser transmission module as claimed in claim 1 wherein said element array is an array of holographic optical elements.

3. A directable laser transmission module as claimed in claim 1 wherein said element array is an array of diffractive optical elements.

4. A directable laser transmission module as claimed in claim 1 wherein:

said laser array comprises a substantially planar substrate upon which said first-beam vertical cavity surface emitting laser is formed; and said element array comprises a substantially planar medium upon which said first refractive optical element is formed, wherein said planar medium is positioned substantially parallel to said planar substrate.

5. A directable laser transmission module as claimed in claim 4 wherein:

said first-beam vertical cavity surface emitting laser beam is generated by said first-beam vertical cavity surface emitting laser having an axis substantially perpendicular to said planar substrate; and said element array is positioned such that said axis substantially perpendicularly intersects said planar medium at one of said refractive optical elements.

6. A directable laser transmission module as claimed in claim 1 wherein:

said first beam vertical cavity surface emitting laser produces a divergent laser beam; and said divergent laser beam is intersected and directed by said first refractive optical elements.

7. A directable laser transmission module as claimed in claim 6 wherein said first refractive Optical element collimates said divergent laser beam intersected and directed thereby.

8. A directable laser transmission module as claimed in claim 1 additionally comprising a plurality of collimators, wherein each of said collimators is configured to collimate said first-beam vertical cavity surface emitting laser beam after said first-beam vertical cavity surface emitting laser beam has been intersected and directed by said refractive optical element configured to intersect and direct said first-beam vertical cavity surface emitting laser beam.

9. A directable laser transmission module as claimed in claim 1 wherein said laser array is an array of N vertical cavity surface emitting lasers where "N" is a positive integer greater than eight.

10. A directable laser transmission module as claimed in claim 9 wherein said element array is an array of at least N refractive optical elements.

11. A directable laser transmission module as claimed in claim 1 wherein said module aerially transmits said first communication signal to said first predetermined reception location.

12. A directable laser transmission module residing at a predetermined transmission location and configured to direct a communication signal to a predetermined reception location, said module comprising:

a beam subcontroller configured to receive said communication signal;

a vertical cavity surface emitting laser coupled to said beam subcontroller, wherein said vertical cavity surface emitting laser is configured to produce a vertical cavity surface emitting laser beam under the control of said beam subcontroller that is modulated with said communication signal; and a refractive optical element positioned proximate said vertical cavity surface emitting laser and configured so that said vertical cavity surface emitting laser beam is intersected and directed by said refractive optical element.

13. A directable laser transmission module as claimed in claim 12 wherein said refractive optical element is one of a holographic optical element and a diffractive optical element.

14. A directable laser transmission module as claimed in claim 12 wherein:

said vertical cavity surface emitting laser is formed upon a substantially planar substrate; and said refractive optical element is formed upon a substantially planar medium, wherein said medium is positioned substantially parallel to said planar substrate.

15. A directable laser transmission module as claimed in claim 14 wherein:

said vertical cavity surface emitting laser beam generated by said vertical cavity surface emitting laser has an axis substantially perpendicular to said planar substrate; and said refractive optical element is positioned such that said laser beam axis substantially perpendicularly intersects said planar medium at said refractive optical element.

16. A directable laser transmission module as claimed in claim 12 wherein said vertical cavity surface emitting laser beam is directed by said refractive optical element to said predetermined reception location.

17. A directable laser transmission module as claimed in claim 12 wherein:

said vertical cavity surface emitting laser beam is divergent; and said refractive optical element collimates said vertical cavity surface emitting laser beam.

18. A directable laser transmission module as claimed in claim 12 wherein:

said vertical cavity surface emitting laser is one of a plurality of said vertical cavity surface emitting lasers, wherein each of said vertical cavity surface emitting lasers is configured to generate a vertical cavity surface emitting laser beam, and wherein all of said vertical cavity surface emitting lasers are substantially collectively controlled by said communication signal; and said refractive optical element is one of a plurality of said refractive optical elements configured so that each of said vertical cavity surface emitting laser beams is intersected and directed by one of said refractive optical elements to said predetermined reception location.

19. A directable laser transmission module residing at a predetermined transmission location and configured to direct a plurality of communication signals to a plurality of predetermined reception locations, said module comprising:

a plurality of beam subcontrollers that are configured to receive said plurality of communication signals;

an array of vertical cavity surface emitting lasers coupled to said plurality of beam subcontrollers, said array of vertical cavity surface emitting lasers formed upon a substantially planar substrate, wherein each of said vertical cavity surface emitting lasers is configured to generate a divergent laser beam under the control of said plurality of beam subcontrollers that is modulated with said plurality of communication signals, said divergent laser beam having an axis substantially perpendicular to said substantially planar substrate, wherein each of said plurality communication signals is carried by at least one of said divergent laser beams, and wherein one of said plurality of communication signals is carried by a plurality of said divergent laser beams; and an array of refractive optical elements formed upon a substantially planar medium positioned proximate said array of vertical cavity surface emitting lasers and substantially parallel to said substantially planar substrate so each of said divergent laser beams is intersected by only one of said refractive optical elements substantially perpendicularly to a laser beam axis, wherein each of said laser beams carrying said one of said plurality of communication signals is intersected, collimated, and directed by one of said refractive optical elements to a common one of said predetermined reception locations, and wherein said one laser beam carrying another of said communication signals is intersected, collimated, and directed by another of said refractive optical elements to another of said predetermined reception locations.

\* \* \* \* \*